United States Patent [19]
Takahashi et al.

[11] Patent Number: 5,857,848
[45] Date of Patent: Jan. 12, 1999

[54] TRANSFER APPARATUS AND VERTICAL HEAT-PROCESSING SYSTEM USING THE SAME

[75] Inventors: Kiichi Takahashi, Esashi; Hiroshi Kikuchi, Iwate-ken, both of Japan

[73] Assignee: Tokyo Electron Limited, Tokyo, Japan

[21] Appl. No.: 926,475

[22] Filed: Sep. 10, 1997

[30] Foreign Application Priority Data

Sep. 13, 1996 [JP] Japan .................................. 8-265461

[51] Int. Cl.⁶ .............................. F27D 5/00; B65G 49/07
[52] U.S. Cl. .......................... 432/253; 432/239; 414/222; 414/937; 414/940
[58] Field of Search ............................. 432/5, 6, 11, 152, 432/239, 241, 253; 414/222, 937, 936, 938, 940

[56] References Cited

U.S. PATENT DOCUMENTS

| | | | |
|---|---|---|---|
| 4,740,135 | 4/1988 | Shulenberger | 414/935 |
| 5,055,036 | 10/1991 | Asano et al. | 432/241 |
| 5,110,248 | 5/1992 | Asano et al. | 414/416 |
| 5,409,348 | 4/1995 | Suzuki | 414/937 |
| 5,590,996 | 1/1997 | Thompson et al. | 414/937 |
| 5,645,391 | 7/1997 | Ohsawa | 414/937 |

*Primary Examiner*—Teresa J. Walberg
*Assistant Examiner*—Gregory Wilson
*Attorney, Agent, or Firm*—Oblon, Spivak, McClelland, Maier & Neustadt, P.C.

[57] ABSTRACT

A vertical heat treatment system has a transfer apparatus for transferring semiconductor wafers and a cassette serving as a transport container for the semiconductor wafers. The transfer apparatus has a base disposed to be vertically movable and rotatable within a horizontal plane. Wafer arms for transferring the wafers placed on them are disposed on the base. The wafer arms can reciprocally move on the base between a standby position and an advanced position in the horizontal direction. A cassette arm for transferring a cassette placed on it is also disposed on the base. The cassette arm can reciprocally move on the base between a retreat position and a protruded position in the horizontal direction. The wafer arms and the cassette arm are reciprocally movable in opposite directions to oppose each other. While the wafer arms and the cassette arm are at the standby position and the retreat position, respectively, a holding portion of the cassette arm is present immediately above the wafer arms.

20 Claims, 6 Drawing Sheets

TRANSFER APPARATUS AND VERTICAL HEAT-PROCESSING SYSTEM USING THE SAME

BACKGROUND OF THE INVENTION

The present invention relates to a transfer apparatus for transferring flat substrates, e.g., semiconductor wafers, and a container for storing them, and a treatment system using the transfer apparatus.

In the manufacture of semiconductor devices, a treatment system such as a vertical heat treatment system is used to perform various types of treatments, e.g., oxidation, diffusion, CVD, and the like, for semiconductor wafers as target substrates. In this treatment system, a cassette (also called a carrier) as a transport container storing a plurality of wafers is loaded/unloaded by a transport robot or an operator through an in/out section. A cassette storing new wafers is arranged on a shelf in the system, and the wafers are mounted from the cassette on the shelf to a boat. The boat on which the wafers are mounted is charged in a heat treatment furnace, and the wafers are subjected to a predetermined treatment. When the predetermined heat treatment is ended, the boat is unloaded from the heat treatment furnace, and the treated wafers are returned from the boat to the cassette in the order opposite to that described above.

A transfer apparatus in which a cassette transfer member is attached to the drive system of a wafer transfer member in such a treatment system is known (Jpn. Pat. Appln. KOKAI Publication No. 3-48439). This transfer apparatus has a vertically movable and rotatable base, and a cassette transfer member attached to the base, in addition to the wafer transfer member. The cassette transfer member is disposed back to back with the wafer transfer member, and is advanced and retreated by an air cylinder in a direction opposite to the wafer transfer member. This reduces the space occupied by the transfer mechanism and down-sizes the treatment system.

In this transfer apparatus, the radius of turn during cassette transfer becomes large because of the usage of the air cylinder and the arrangement of the cassette transfer member. A certain degree of extra space be given around the transfer apparatus, thus limiting any reduction in space in the horizontal direction. This problem becomes conspicuous particularly as the diameter of the wafer increases and accordingly the size of the cassette increases.

BRIEF SUMMARY OF THE INVENTION

It is, therefore, an object of the present invention to provide a transfer apparatus which has a function of transferring target substrates and a container for the target substrates and which can be installed in a space smaller than that in the conventional case in the horizontal direction, and a vertical heat treatment system using the transfer apparatus. The present invention particularly takes into consideration the fact that, in building a transfer apparatus, a large installation space in the vertical direction is originally required in a vertical heat treatment system.

According to a first aspect of the present invention, there is provided a transfer apparatus comprising:
  a base disposed to be vertically movable and rotatable within a horizontal plane;
  a substrate arm disposed on the base to transfer a single substrate, which belongs to a group of substrates having substantially the same outline size, while being in contact with the substrate, the substrate arm having a root portion attached to the base and a support portion extending from the root portion to support the substrate;
  a first drive mechanism for reciprocally moving the substrate arm on the base between a standby position and an advanced position in a horizontal direction;
  a container arm disposed on the base to transfer a container, which stores a plurality of substrates belonging to the group, while being in contact with the container, the container arm having a proximal portion attached to the base and a holding portion extending from the proximal portion to hold the container; and
  a second drive mechanism for reciprocally moving the container arm on the base between a retreat position and a protruded position in a horizontal direction, wherein
  a direction along which the substrate arm moves from the standby position to the advanced position and a direction along which the container arm moves from the retreat position to the protruded position are substantially opposite to each other, and while the substrate arm and the container arm are located at the standby position and the retreat position, respectively, the holding portion of the container arm is present immediately above the substrate arm.

According to a second aspect of the present invention there is provided a vertical heat treatment system comprising:
  (a) a heat treatment furnace for storing a plurality of substrates, which belong to a group of substrates having substantially the same outline size, to subject the plurality of substrates to heat treatment all together, the substrates being supported on a boat in the heat treatment furnace in a stacked state with gaps therebetween;
  (b) a boat transport mechanism for transporting the boat together with the substrates, between a position in the heat treatment furnace and a transfer station outside the heat treatment furnace;
  (c) an in/out section for loading/unloading a container storing the plurality of substrates belonging to the group in/from the system;
  (d) a container placing station for placing the container in the system; and
  (e) a transfer apparatus used to transfer the container between the in/out section and the container placing station and to transfer the substrates between the container arranged on the container placing station and the boat placed on the transfer station, the transfer apparatus comprising,
  a base disposed to be vertically movable and rotatable within a horizontal plane,
  a substrate arm disposed on the base to transfer a ingle substrate, which belongs to the group, while being in contact with the substrate, the substrate arm having a root portion attached to the base and a support portion extending from the root portion to support the substrate,
  a first drive mechanism for reciprocally moving the substrate arm on the base between a standby position and an advanced position in a horizontal direction,
  a container arm disposed on the base to transfer the container while being in contact with the container, the container arm having a proximal portion attached to the base and a holding portion extending from the proximal portion to hold the container, and
  a second drive mechanism for reciprocally moving the container arm on the base between a retreat position and a protruded position in a horizontal direction, wherein a direction along which the substrate arm moves from the standby position to the advanced position and a direction along which the container arm moves from the retreat position to the protruded position are substantially opposite to each other, and while the substrate arm and the container arm are located at the standby position and the retreat position, respectively, the holding portion of the container arm is present immediately above the substrate arm.

DETAILED DESCRIPTION OF THE INVENTION

Figure 2:
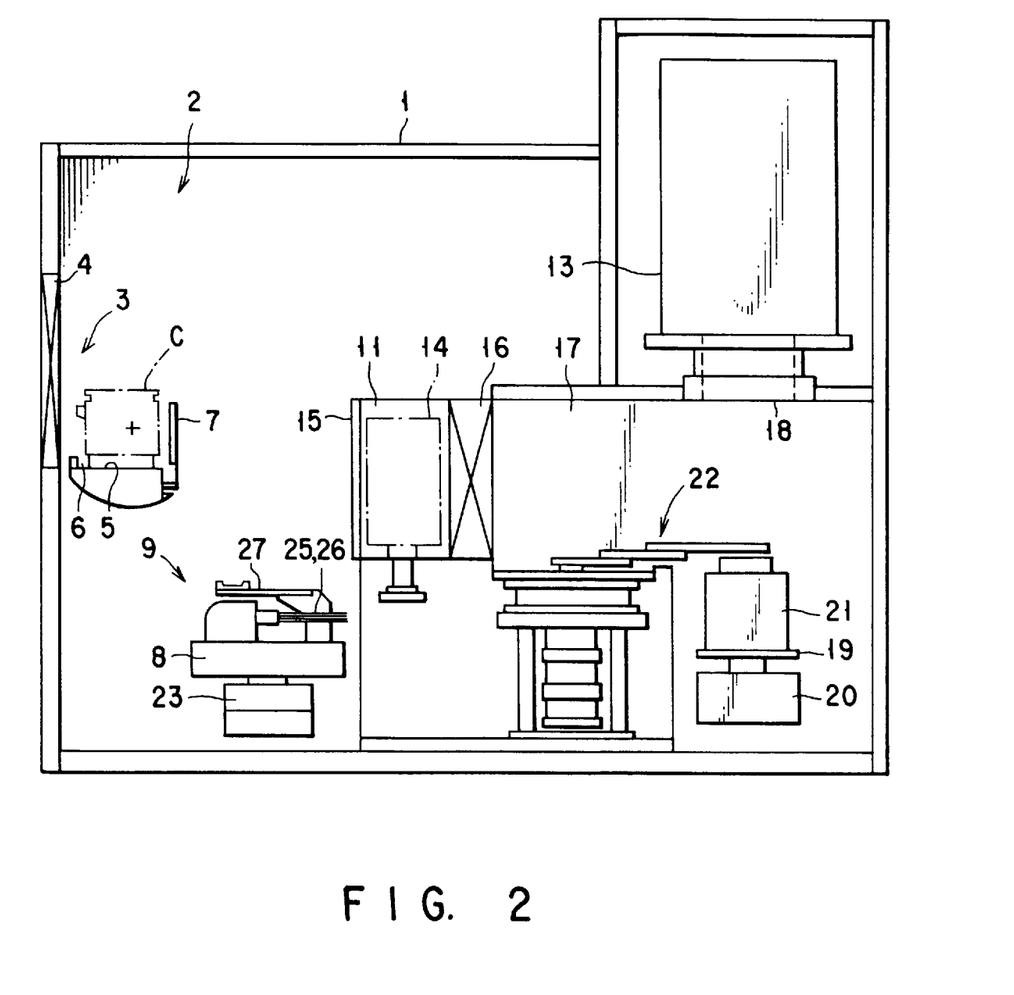
FIG. 2 is a side sectional view showing the schematic arrangement of a vertical heat treatment system using the transfer apparatus shown in FIG. 1.
Figure 3:
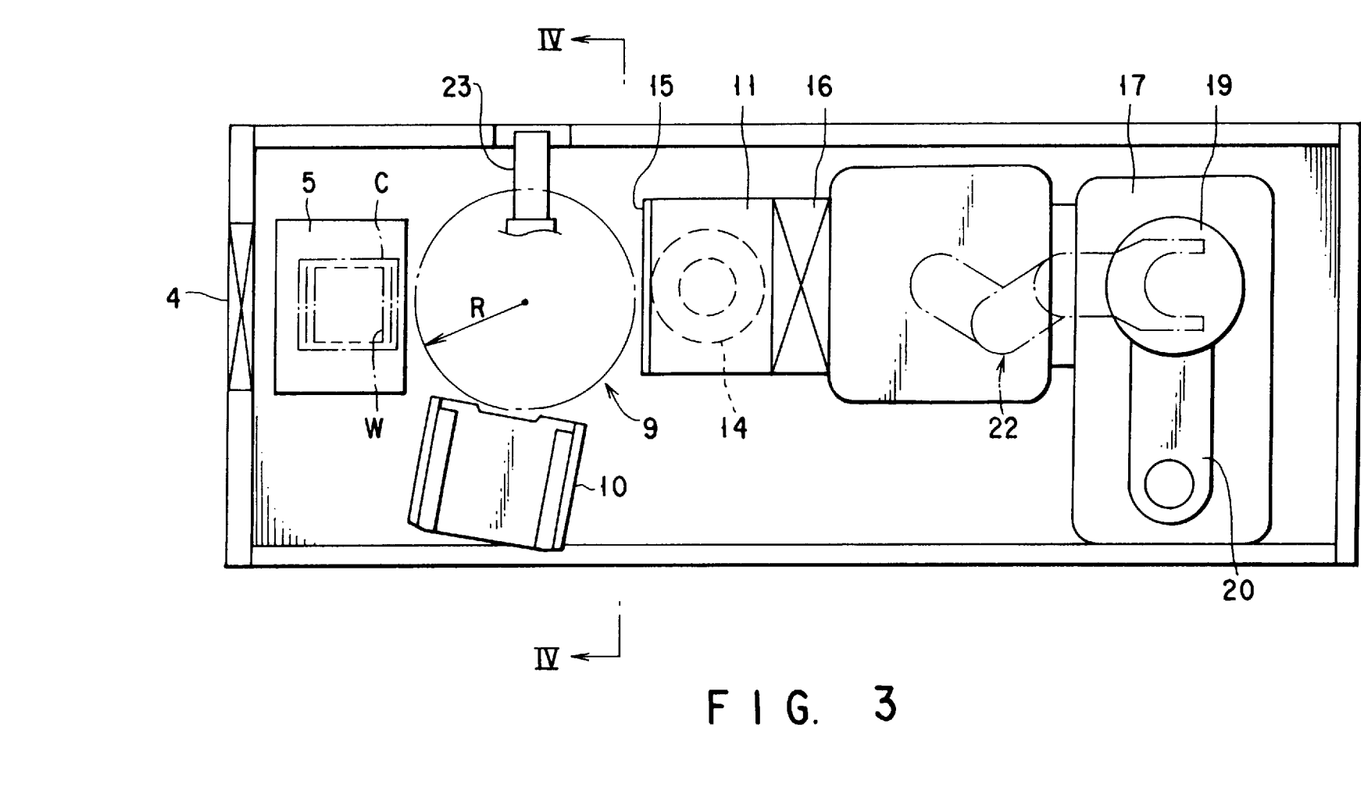
FIG. 3 is a sectional plan view of the treatment system shown in FIG. 2.

As shown in FIGS. 2 and 3, an in/out section 3 is disposed in the front side of a casing 1 of a vertical heat treatment system to load/unload a transport container, e.g., a cassette C, for semiconductor wafers W as the target substrates in/from the system. The in/out section 3 has a loading/unloading port 4 having an opening/closing gate and disposed on the side wall of the casing 1, and a table 5 disposed near the loading/unloading port 4 to place the cassette C on it. The cassette C can store a plurality of, e.g., about 25 wafers W having the same size, e.g., an 8-inch diameter, with a predetermined pitch in a vertically upright state.

Retaining portions 6 and 7 for retaining the cassette C from the front and rear, an orientation flat aligner (not shown) for aligning the orientation flat of the wafers W in the cassette C, and the like are disposed on the table 5. The table 5 is vertically and pivotally disposed, and can pivot the cassette C through about 90° to set the wafers W in the cassette C from the vertical state to the horizontal state.

A transfer apparatus 9 having a vertically movable, rotatable base 8 is disposed in the casing 1. The table 5 described above, a cassette station, i.e., a shelf 10, for storing and arranging the cassette C on it, and a first load-lock chamber 11 serving as a wafer transfer station surround the base 8 almost concentrically. The shelf 10 has a plurality of levels 12, e.g., 4 levels in the case of drawings, so that a plurality of cassettes C can be placed in it in the direction of height.

A space 2 in the casing 1 where the table 5, the transfer apparatus 9, the shelf 10, and the like are present is connected to a vertical heat treatment furnace 13 (to be described later) through the first load-lock chamber 11 and a second load-lock chamber 17. The first load-lock chamber 11 serves as a pre-vacuum chamber and as a transfer station for loading/unloading wafers in/from a quartz boat 14 for heat treatment. The boat 14 can support a plurality of, e.g., 30 wafers W having the same size, e.g., an 8-inch diameter, in a stacked state with gaps between themselves. The boat 14 is loaded in/unloaded from the vertical heat treatment furnace 13 while it has a plurality of wafers W stacked on it.

The first load-lock chamber 11 is arranged at such a position that it opposes the table 5 with the base 8 therebetween. An opening having a load-lock door 15 is formed in the front side of the first load-lock chamber 11, which opposes the base 8. The second load-lock chamber 17 is continuously arranged behind the first load-lock chamber 11 through a gate valve 16.

The vertical heat treatment furnace 13 having a charging port (furnace port) 18 at its lower portion is located on the rear side of the casing 1. The second load-lock chamber 17 defines a loading area (operation area) under the heat treatment furnace 13. For example, the first and second load-lock chambers 11 and 17 can be evacuated to substantially the same vacuum degree as that for heat treatment of the heat treatment furnace 13, e.g., 1 Torr.

The first load-lock chamber 11 is set at the same pressure as that of the second load-lock chamber 17 before it is caused to communicate with the second load-lock chamber 17 by opening the gate valve 16. The first load-lock chamber 11 is also set at the pressure (atmospheric pressure) of the space 2 in the casing 1 before it is caused to communicate with the interior of the casing 1 by opening the load-lock door 15 of the first load-lock chamber 11 while the gate valve 16 is closed.

A lid 19 for opening/closing the charging port 18 of the heat treatment furnace 13 is arranged under the heat treatment furnace 13 such that it can be vertically moved by an elevating arm 20 of an elevating mechanism. The boat 14 is placed on the lid 19 through a quartz heat insulating cylinder 21. A transport arm mechanism 22 for transporting the boat 14 from the heat insulating cylinder 21 to the first load-lock chamber 11 or vice versa is disposed in the second load-lock chamber 17. The heat insulating cylinder 21 can be unloaded from the lid 19 to the outside of the casing 1 through the first load-lock chamber 11 with the transport arm mechanism 22 as required, e.g., when it needs cleaning.

Figure 1:
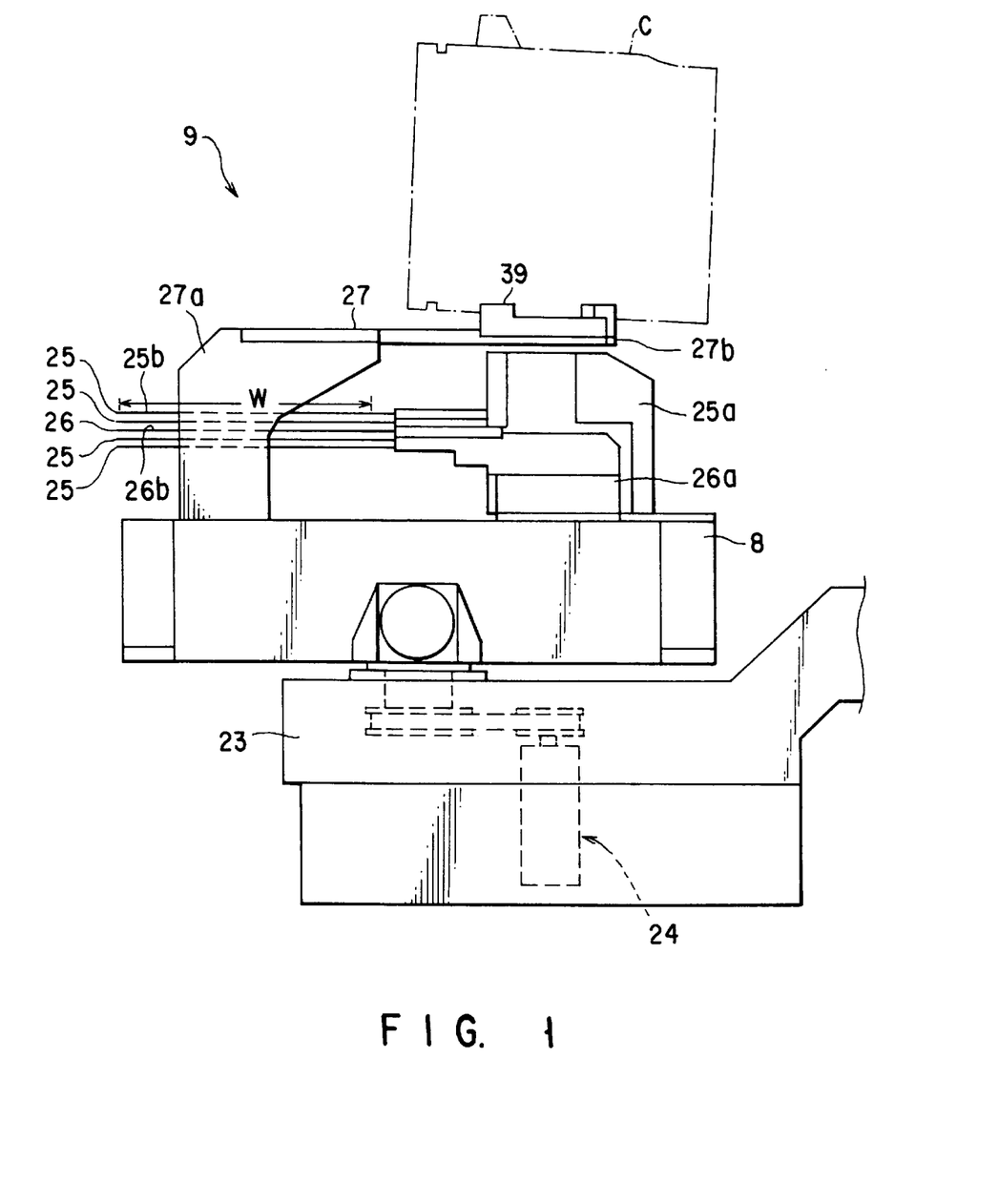
FIG. 1 is a side view showing the main part of a transfer apparatus according to the embodiment of the present invention.
Figure 4:
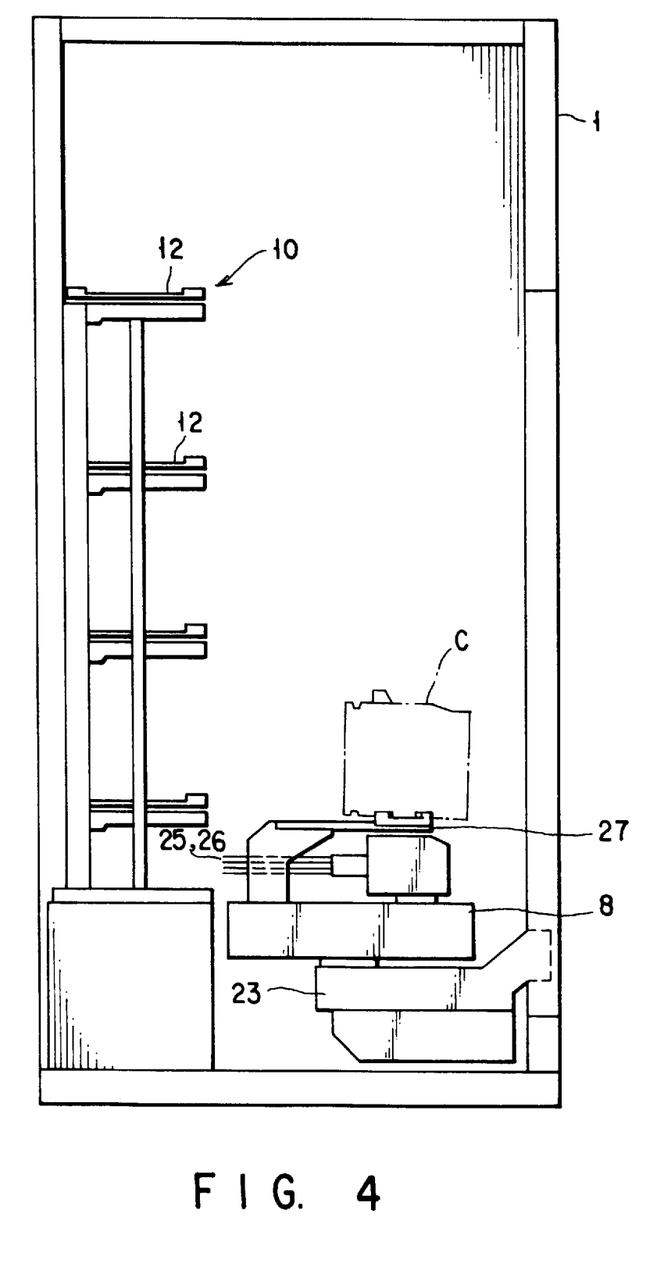
FIG. 4 is an enlarged sectional view taken along the line IV—IV of FIG. 3.

As is also shown in FIG. 4, the transfer apparatus 9 has an elevating base 23 which can be vertically moved by the elevating mechanism using a ball screw, and the like. The base 8 is attached on the elevating base 23 to be horizontally rotatable. A rotational drive unit 24 is disposed in the elevating base 23, as shown in FIG. 1, to rotationally drive and position the base 8.

A total of five wafer arms 25 and 26 for respectively placing, e.g., 8-inch wafers W, thereon and transferring them, and one cassette arm 27 for placing one cassette C thereon and transferring it are stacked on the base 8. With the wafer arms 25 and 26, the wafers are transferred between the cassette C on the shelf 10 and the boat 14 in the first load-lock chamber 11 serving as the wafer transfer station. With the cassette arm 27, the cassette C is transferred between the table 5 of the in/out section 3 and the shelf 10 serving as a cassette station.

Each of the wafer arms 25 and 26 has a root portion 25a or 26a attached to the base 8, and a support portion 25b or 26b horizontally extending from the root portion to support one wafer W. The wafer arms 25 and 26 can reciprocally move between the standby position (the position shown in FIG. 1) and the advanced position in the horizontal direction. The cassette arm 27 has a proximal portion 27a attached to the base, and a holding portion 27b horizontally extending from the proximal portion to hold the cassette. The cassette arm 27 can reciprocally move between the retreat position (the position shown in FIG. 1) and the protruded position in the horizontal direction.

The direction along which the wafer arms 25 and 26 move from the standby position to the advanced position, and the direction along which the cassette arm 27 moves from the retreat position to the protruded position are opposite. When the wafer arms 25 and 26, and the cassette arm 27, are respectively located at the standby position and the retreat position, as shown in FIG. 1, the root portions 25a and 26a of the wafer arms 25 and 26, and the proximal portion 27a of the cassette arm 27 diametrically oppose each other with the rotating shaft of the base 8 therebetween. In this state, the holding portion 27b of the cassette arm 27 is located immediately above the root portions 25a and 26a of the wafer arms 25 and 26. In this state, the cassette C held by the holding portion 27b of the cassette arm 27 is present outside the range (see W of FIG. 1) of the planar outline of the semiconductor wafers W supported by the support portions 25b and 26b of the wafer arms 25 and 26. In this state, the cassette C held by the holding portion 27b of the holding portion 27b is present within the range of the planar outline of the base 8. As a result, an effective radius R of turn of the transfer apparatus can be reduced, and contamination of the wafers W by particles dropping from the outer surface of the cassette C can be prevented.

Figure 5:
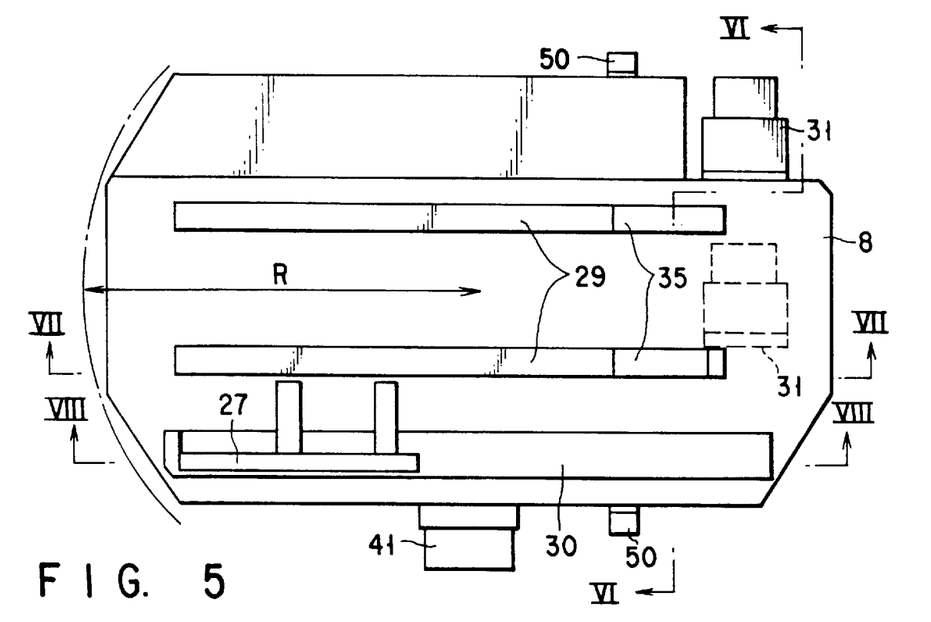
FIG. 5 is a schematic plan view of the base of the transfer apparatus shown in FIG. 1.
Figure 6:
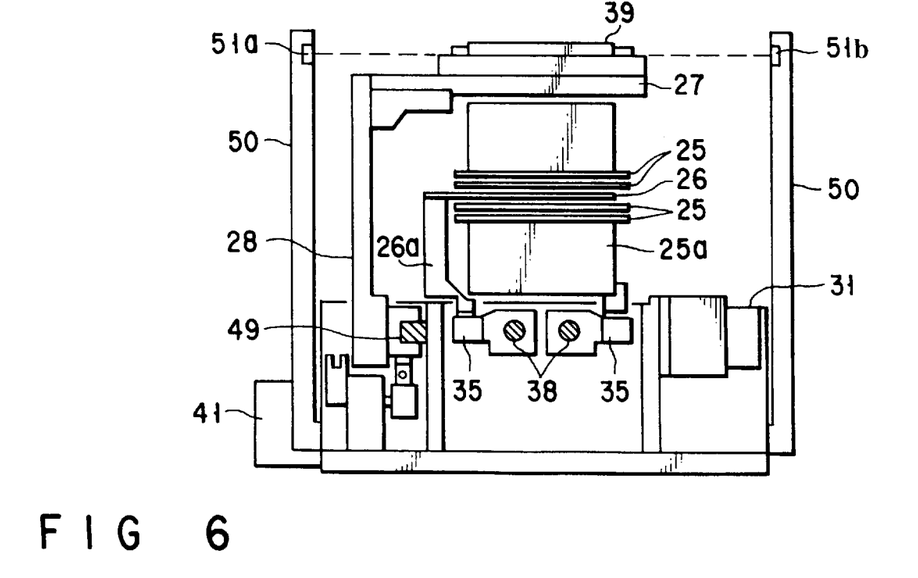
FIG. 6 is a sectional view taken along the line VI—VI of FIG. 5.

More specifically, as shown in FIGS. 5 and 6, the base 8 is formed into a horizontally elongated box, and its four corners are cut off to reduce the radius R of turn. Two slits 29 are formed in the upper surface of the base 8 near its center to reciprocally move the wafer arms 25 and 26 along their longitudinal direction. One slit 30 is formed in the upper surface of the base 8 near its one side to reciprocally move the cassette arm 27.

The support portions 25b and 26b of the wafer arms 25 and 26 are made of thin plates extending horizontally in the direction of reciprocal movement, and each of them has a recessed portion (not shown) in its upper surface to place a wafer W on it at a predetermined position. As a total of five wafer arms 25 and 26 are used, five wafers W can be transferred simultaneously. The middle wafer arm (sub wafer arm) 26 can reciprocally move independently of the two upper and two lower wafer arms (main wafer arms) 25. Hence, the sub wafer arm 26 can transfer the wafers W one by one. The root portions 25a of the two upper and two lower main wafer arms 25 are integrated and are connected to a drive mechanism in the base 8 through one slit 29. The root portion 26a of the middle sub wafer arm 26 is connected to another drive mechanism in the base 8 through the other slit 29.

Figure 7:
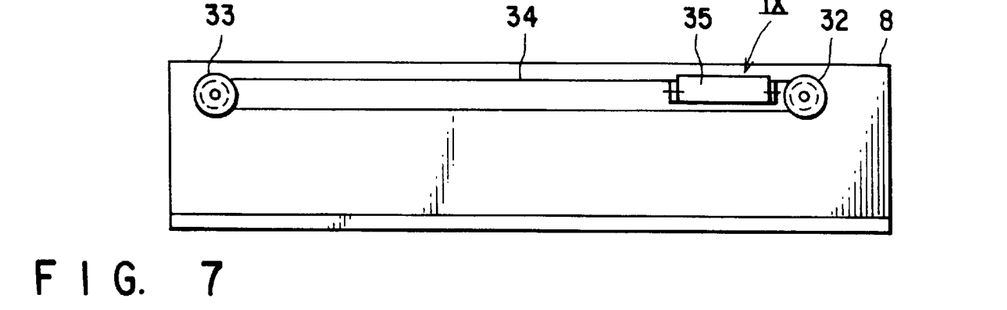
FIG. 7 is a sectional view taken along the line VII—VII of FIG. 5.
Figure 9:
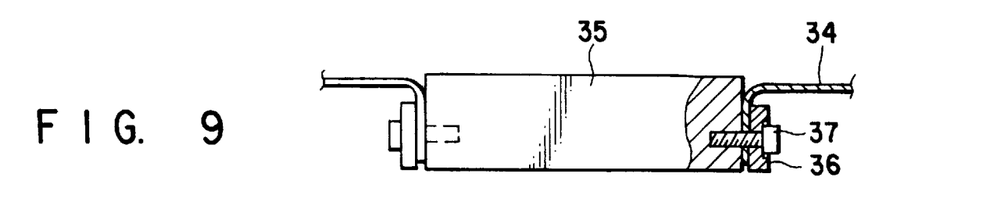
FIG. 9 is an enlarged view of a portion IX of FIG. 7.

Each of the drive mechanism of the main wafer arms 25 and that of the sub wafer arm 26 is constituted as shown in FIG. 7. A driving pulley 32 rotationally driven by a motor (stepping motor) 31, and a driven pulley 33, are disposed at the positions on the two ends in the longitudinal direction of each slit 29. A belt (timing belt) 34 is wound on the two pulleys 32 and 33. The belt 34 used is a belt having ends, and its two end portions in the longitudinal direction are fixed at the two end portions of a movable block 35 with screws 37 through retainers 36, as shown in FIG. 9. The root portions 25a of the main wafer arms 25 or the root portion 26a of the sub wafer arm 26 is fixed on the movable block 35. The movable blocks 35 are slidably supported by guides 38 disposed in the base 8 in the longitudinal direction (see FIG. 6).

The holding portion 27b of the cassette arm 27 extends horizontally above the wafer arms 25 and 26 in a direction opposite to the extended direction of the support portions 25b and 26b of the wafer arms 25 and 26. A locking means 39 for placing and locking the cassette C thereon is disposed on the distal end of the holding portion 27b. The proximal portion 27a of the cassette arm 27 is connected to a drive mechanism in the base 8, which is different from the two drive mechanisms of the wafer arms, through the slit 30.

Figure 8:
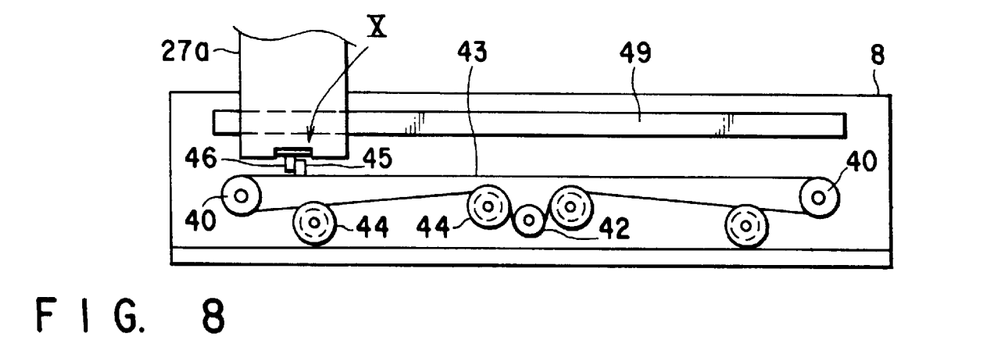
FIG. 8 is a sectional view taken along the line VIII—VIII of FIG. 5.

The drive mechanism of the cassette arm 27 has an arrangement as shown in FIG. 8. Driven pulleys 40 are disposed at the positions on the two ends in the longitudinal direction of the slit 30. A driving pulley 42 rotationally driven by a motor (stepping motor) 41 is interposed between the two driven pulleys 40. A belt (timing belt) 43 is wound on the driven pulleys 40 and driving pulley 42. The lower portion of the belt 43 is wound on the driving pulley 42 through guide pulleys 44.

Figure 10:
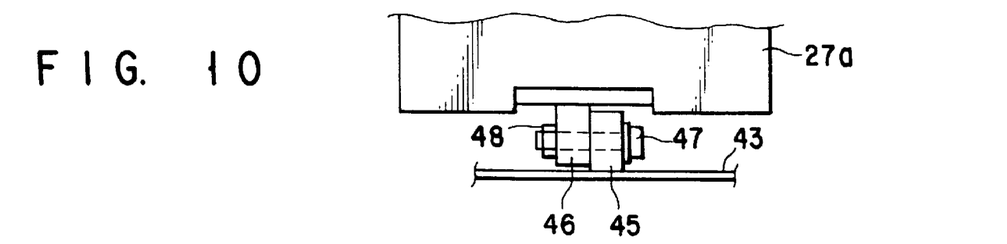
FIG. 10 is an enlarged view of a portion X of FIG. 8.

The belt 43 employs a belt having ends, and a piece 45 having a small width in its moving direction projects from the upper surface of the upper portion of the belt 43, as shown in FIG. 10, to fix the cassette arm 27. Although the piece 45 is welded on the upper surface of the belt 43 in FIG. 10, it may be integrally formed on the upper surface of the belt 43. A similar piece 46 projects from the lower end portion of the proximal portion 27a of the cassette arm 27. The piece 46 has a small width in its moving direction along which it abuts against one end in the moving direction of the piece 45. The pieces 45 and 46 are fastened and fixed with each other with a screw 47 and a nut 48. The connector constituted by these members 45 to 48 between the belt 43 and the cassette arm 27 has a sufficiently small length such that it does not exceed the two ends of the proximal portion 27a in the rotating direction (moving direction) of the belt 43.

Furthermore, the cassette arm 27 is slidably supported by a guide (linear guide) 49 disposed in the base 8 in the longitudinal direction. Support columns 50 are formed upright on the two side portions of the base 8, and an optical sensor comprising a light-emitting element 51a and a light-receiving element 51b is attached to the upper end portions of the two support columns 50. This optical sensor detects whether or not a cassette C is on the holding portion 27b of the cassette arm 27.

The function of the vertical heat treatment system having the above arrangement will be described.

A cassette C storing wafers W in the vertical upright state is loaded in the casing 1 of the treatment system through the loading/unloading port 4 and is placed on the table 5. Subsequently, the cassette C is retained by the retaining portions 6 and 7 from the front and rear. After orientation flat aligning and wafer number counting operations, the cassette C is pivoted through about 90° together with the table 5 in order to set the wafers W horizontal. The holding portion 27b of the cassette arm 27 is inserted under the cassette C by the vertical movement of the elevating base 23, the turn of the base 8, and the movement of the cassette arm 27. The cassette C is transferred from the table 5 to the shelf 10 by the holding portion 27b of the cassette arm 27.

When a predetermined count of cassettes C are placed on the shelf 10 in this manner, the support portions 25b and 26b of the wafer arms 25 and 26 are inserted in the cassettes C on the shelf 10 by the vertical movement of the elevating base 23, the turn of the base 8, and the movement of the wafer arms 25 and 26. The wafers W are removed from the cassette C and is mounted on the boat 14 arranged in the first load-lock chamber 11 in advance. At this time, the gate valve 16 between the first load-lock chamber 11 and second load-lock chamber 17 is closed, and the load-lock door 15 of the first load-lock chamber 11 is open.

When a predetermined count of wafers W are mounted on the boat 14 in this manner, the load-lock door 15 is closed, and the interior of the first load-lock chamber 11 is evacuated to a predetermined vacuum degree. The gate valve 16 between the first load-lock chamber 11 and the second load-lock chamber 17 is opened, and the boat 14 is transferred from the interior of the first load-lock chamber 11 onto the heat insulating cylinder 21 in the second load-lock chamber 17 with the transport arm mechanism 22. The gate valve 16 is closed upon moving the boat 14 out of the first load-lock chamber 11. After the boat 14 is mounted, the boat 14 is vertically moved together with the heat insulating cylinder 21 on the lid 19 by the elevating arm 20, and is loaded in the heat treatment furnace 13. The charging port 18 is closed with the lid 19, and predetermined heat treatment is started.

When the heat treatment is ended, the boat 14 is unloaded from the heat treatment furnace 13 into the second load-lock chamber 17 with the operation opposite to that described above, and is transferred into the first load-lock chamber 11. The treated wafers W are transferred from the boat 14 into the empty cassette C on the shelf 10. The cassette C storing the treated wafers W is transferred from the shelf 10 to the table 5 and is unloaded through the loading/unloading port 4.

According to the vertical heat treatment system described above, reduction in space and prevention of particle contamination of the wafers W during the transfer operation can be achieved by using the transfer apparatus 9 having the specific features. More specifically, as described above, in the transfer apparatus 9, the wafer arms 25 and 26 having the support portions 25b and 26b for supporting the wafers W, and the cassette arm 27 having the holding portion 27b for holding the cassette C are disposed to oppose each other and to be reciprocally movable, on the base 8 which is vertically movable and rotatable. When the wafer arms 25 and 26, and the cassette arm 27, are located at the standby position and the retreat position, respectively, the root portions 25a and 26a of the wafer arms 25 and 26, and the proximal portion 27a of the cassette arm 27 diametrically oppose each other with the rotating shaft of the base 8 therebetween. In this state, the holding portion 27b of the cassette arm 27 is present immediately above the root portions 25a and 26a of the wafer arms 25 and 26. In this state, the cassette C held by the holding portion 27b of the cassette arm 27 is present outside the range of the planar outline of the semiconductor wafers W supported by the support portions 25b and 26b of the wafer arms 25 and 26. In this state, the cassette C held by the holding portion 27b of the cassette arm 27 is present within the range of the planar outline of the base 8. As a result, the effective radius R of turn of the transfer apparatus can be reduced, and contamination of the wafers W by particles dropping from the outer surface of the cassette C can be prevented.

As shown in FIG. 8, the connector between the upper surface of the belt 43 of the drive mechanism of the cassette arm 27 and the cassette arm 27 has a sufficiently small length such that it does not exceed the two ends of the proximal portion 27a of the cassette arm 27 in the rotating direction of the belt 43. A larger stroke of movement of the cassette arm 27 can accordingly be obtained within the limited space of the base 8 than that of the drive mechanism shown in FIG. 7. This down-sizes the base 8, and reduces the radius R of turn and decreases the space. In particular, since the four corners of the base 8 are cut off to decrease the radius R of turn and since the belt 43 serving as the moving means of the cassette arm 27 must be arranged in the limited space on one side of the base 8, a connector structure having a short length is very effective. The drive mechanism having a small-length connector structure shown in FIG. 8 can also be directly applied to the drive mechanisms of the wafer arms 25 and 26.

The embodiment of the present invention has been described in detail with reference to the accompanying drawings. The present invention is not limited to the embodiment described above, and various design changes and modifications may be made without departing from the gist of the present invention. For example, the present invention can also be applied to a treatment system which has neither the first load-lock chamber 11 nor the second load-lock chamber 17 and transfers a boat 14 inside a normal-pressure casing 1. In this case, a table of the boat 14 is installed in a transfer station in place of the first load-lock chamber 11. Further, a plurality of shelves 10 may be arranged in the direction of turn of the base 8.

We claim:

1. A transfer apparatus comprising:
    a base disposed to be vertically movable and rotatable within a horizontal plane;
    a substrate arm disposed on said base to transfer a single substrate, which belongs to a group of substrates having substantially the same outline size, while being in contact with the substrate, said substrate arm having a root portion attached to said base and a support portion extending from said root portion to support the substrate;
    a first drive mechanism for reciprocally moving said substrate arm on said base between a standby position and an advanced position in a horizontal direction;
    a container arm disposed on said base to transfer a container, which stores a plurality of substrates belonging to the group, while being in contact with said container, said container arm having a proximal portion attached to said base and a holding portion extending from said proximal portion to hold said container; and
    a second drive mechanism for reciprocally moving said container arm on said base between a retreat position and a protruded position in a horizontal direction, wherein
    a direction along which said substrate arm moves from said standby position to said advanced position and a direction along which said container arm moves from said retreat position to said protruded position are substantially opposite to each other, and while said substrate arm and said container arm are located at said standby position and said retreat position, respectively, said holding portion of said container arm is present immediately above said substrate arm.

2. The apparatus according to claim 1, wherein said substrate arm transfers the substrate which is placed thereon.

3. The apparatus according to claim 2, wherein said container arm transfers said container which is placed thereon.

4. The apparatus according to claim 1, wherein while said substrate arm and said container arm are located at said standby position and said retreat position, respectively, said root portion of said substrate arm and said proximal portion of said container arm oppose each other with a rotating shaft of said base therebetween.

5. The apparatus according to claim 1, wherein while said substrate arm and said container arm are located at said standby position and said retreat position, respectively, said container held by said holding portion of said container arm is present outside a range of a planar outline of the substrate supported by said support portion of said substrate arm.

6. The apparatus according to claim 1, wherein while said container arm is located at said retreat position, said container held by said holding portion of said container arm is present within a range of a planar outline of said base.

7. The apparatus according to claim 1, wherein said first transfer mechanism comprises an endless belt disposed in said base and rotated in two directions, and a connector for connecting an upper surface of said endless belt and said root portion of said substrate arm, said connector having a length shorter than said root portion in said two directions.

8. The apparatus according to claim 1, wherein said second transfer mechanism comprises an endless belt disposed in said base and rotated in two directions, and a connector for connecting an upper surface of said endless belt and said proximal portion of said container arm, said connector having a length shorter than said proximal portion in said two directions.

9. The apparatus according to claim 1, comprising a second substrate arm equivalent to said substrate arm, said second substrate arm moving together with said substrate arm.

10. The apparatus according to claim 1, comprising a second substrate arm equivalent to said substrate arm, said second substrate arm moving independently of said substrate arm.

11. A vertical heat treatment system comprising:
    (a) a heat treatment furnace for storing a plurality of substrates, which belong to a group of substrates having substantially the same outline size, to subject the plurality of substrates to heat treatment all together, the substrates being supported on a boat in said heat treatment furnace in a stacked state with gaps therebetween;
    (b) a boat transport mechanism for transporting said boat together with the substrates, between a position in said heat treatment furnace and a transfer station outside said heat treatment furnace;
    (c) an in/out section for loading/unloading a container storing the plurality of substrates belonging to the group in/from said system;
    (d) a container placing station for placing said container in said system; and
    (e) a transfer apparatus used to transfer said container between said in/out section and said container placing station and to transfer the substrates between said container arranged on said container placing station and said boat placed on said transfer station, said transfer apparatus comprising,
        a base disposed to be vertically movable and rotatable within a horizontal plane,
        a substrate arm disposed on said base to transfer a single substrate, which belongs to the group, while being in contact with the substrate, said substrate arm having a root portion attached to said base and a support portion extending from said root portion to support the substrate,
        a first drive mechanism for reciprocally moving said substrate arm on said base between a standby position and an advanced position in a horizontal direction,
        a container arm disposed on said base to transfer said container while being in contact with said container, said container arm having a proximal portion attached to said base and a holding portion extending from said proximal portion to hold said container, and
        a second drive mechanism for reciprocally moving said container arm on said base between a retreat position and a protruded position in a horizontal direction, wherein
            a direction along which said substrate arm moves from said standby position to said advanced position and a direction along which said container arm moves from said retreat position to said protruded position are substantially opposite to each other, and while said substrate arm and said container arm are located at said standby position and said retreat position, respectively, said holding portion of said container arm is present immediately above said substrate arm.

12. The system according to claim 11, wherein said substrate arm transfers the substrate which is placed thereon.

13. The system according to claim 12, wherein said container arm transfers said container which is placed thereon.

14. The system according to claim 11, wherein while said substrate arm and said container arm are located at said standby position and said retreat position, respectively, said root portion of said substrate arm and said proximal portion of said container arm oppose each other with a rotating shaft of said base therebetween.

15. The system according to claim 11, wherein while said substrate arm and said container arm are located at said standby position and said retreat position, respectively, said container held by said holding portion of said container arm is present outside a range of a planar outline of the substrate supported by said support portion of said substrate arm.

16. The system according to claim 11, wherein while said container arm is located at said retreat position, said container held by said holding portion of said container arm is present within a range of a planar outline of said base.

17. The system according to claim 11, wherein said first transfer mechanism comprises an endless belt disposed in said base and rotated in two directions, and a connector for connecting an upper surface of said endless belt and said root portion of said substrate arm, said connector having a length shorter than said root portion in said two directions.

18. The system according to claim 11, wherein said second transfer mechanism comprises an endless belt disposed in said base and rotated in two directions, and a connector for connecting an upper surface of said endless belt and said proximal portion of said container arm, said connector having a length shorter than said proximal portion in said two directions.

19. The system according to claim 11, comprising a second substrate arm equivalent to said substrate arm, said second substrate arm moving together with said substrate arm.

20. The system according to claim 11, comprising a second substrate arm equivalent to said substrate arm, said second substrate arm moving independently of said substrate arm.

* * * * *